(12) United States Patent
Zou et al.

(10) Patent No.: US 11,297,414 B2
(45) Date of Patent: Apr. 5, 2022

(54) MEMS MICROPHONE

(71) Applicant: Goertek, Inc., Weifang (CN)

(72) Inventors: Quanbo Zou, Weifang (CN); Yongwei Dong, Weifang (CN)

(73) Assignee: Goertek, Inc., Weifang (CN)

( * ) Notice: Subject to any disclaimer, the term of this patent is extended or adjusted under 35 U.S.C. 154(b) by 163 days.

(21) Appl. No.: 16/760,803

(22) PCT Filed: Sep. 6, 2018

(86) PCT No.: PCT/CN2018/104439
§ 371 (c)(1),
(2) Date: Apr. 30, 2020

(87) PCT Pub. No.: WO2020/000648
PCT Pub. Date: Jan. 2, 2020

(65) Prior Publication Data
US 2020/0359127 A1    Nov. 12, 2020

(30) Foreign Application Priority Data

Jun. 25, 2018   (CN) .......................... 201810660799.5

(51) Int. Cl.
*H04R 1/28*       (2006.01)
*B81B 3/00*       (2006.01)
*H04R 19/04*      (2006.01)

(52) U.S. Cl.
CPC .......... *H04R 1/283* (2013.01); *B81B 3/0018* (2013.01); *H04R 19/04* (2013.01); *B81B 2201/0257* (2013.01); *H04R 2201/003* (2013.01)

(58) Field of Classification Search
CPC .............. H04R 1/283; H04R 2201/003; H04R 19/005; H04R 31/006; B81B 3/0018; B81B 2201/0257
See application file for complete search history.

(56) References Cited

U.S. PATENT DOCUMENTS

| | | | |
|---|---|---|---|
| 6,870,939 B2 * | 3/2005 | Chiang ................ | H04R 19/016 307/400 |
| 10,349,185 B2 | 7/2019 | Hu | |
| 2003/0046554 A1 | 3/2003 | Leydier et al. | |
| 2005/0176163 A1 | 8/2005 | Brosnihan et al. | |
| 2008/0089181 A1 | 4/2008 | Adachi et al. | |

(Continued)

FOREIGN PATENT DOCUMENTS

| CN | 106303867 A | 1/2017 |
|---|---|---|
| JP | 2010045430 A | 2/2010 |

*Primary Examiner* — Tuan D Nguyen
(74) *Attorney, Agent, or Firm* — Baker Botts, L.L.P.

(57) ABSTRACT

An MEMS microphone is provided, comprising a substrate and a vibration diaphragm supported above the substrate by a spacing portion, the substrate, the spacing portion, and the vibration diaphragm enclosing a vacuum chamber, and a static deflection distance of the vibration diaphragm under an atmospheric pressure being less than a distance between the vibration diaphragm and the substrate, wherein: a lower electrode forming a capacitor structure with the vibration diaphragm is provided on the substrate, and an electret layer providing an electric field between the vibration diaphragm and the lower electrode is provided on the substrate

10 Claims, 2 Drawing Sheets

(56) References Cited

U.S. PATENT DOCUMENTS

| | | | |
|---|---|---|---|
| 2014/0044899 A1* | 2/2014 | Golovashchenko | F16L 13/143 428/34.1 |
| 2016/0165355 A1* | 6/2016 | Khenkin | H04R 31/003 307/400 |
| 2016/0192085 A1* | 6/2016 | Lee | B81C 1/00246 381/174 |

* cited by examiner

MEMS MICROPHONE

CROSS-REFERENCE TO RELATED APPLICATIONS

This application is a National Stage of International Application No. PCT/CN2018/104439, filed on Sep. 6, 2018, which claims priority to Chinese Patent Application No. 201810660799.5, filed on Jun. 25, 2018, both of which are hereby incorporated by reference in their entireties.

TECHNICAL FIELD

The present disclosure relates to the field of acoustic-electric conversion, and more particularly to an MEMS (micro electro-mechanical systems) microphone, especially a microphone structure with a high SNR (signal-to-noise ratio).

BACKGROUND

Prevailing MEMS microphones, such as a capacitive sensing structure and a piezoelectric sensing structure, are designed with a big back cavity with an ambient pressure, so as to ensure that the rigidity of flowing air is much smaller than that of the vibration diaphragm. A volume of the back cavity is generally much larger than 1 mm$^3$, and for example is generally designed to be 1-15 mm$^3$. Moreover, a cavity of a microphone chip needs to be open when the microphone chip is packaged, which limits a minimum package size of the MEMS microphone (>3 mm$^3$).

The reason is that if the volume of the back cavity is too small, a circulation of air is blocked, and the rigidity of the air will greatly reduce the mechanical sensitivity of the vibration diaphragm. In addition, for pressure equalization, dense perforation holes are usually designed in a backplate, and the air flow resistance in the gap or perforation holes caused by air viscosity becomes a dominant factor of the MEMS microphone noise, thereby limiting the high signal-to-noise ratio performance of the microphone.

SUMMARY

An object of the present disclosure is to provide a novel technical solution of an MEMS microphone.

According to a first aspect of the present disclosure, there is provided an MEMS microphone, comprising a substrate and a vibration diaphragm supported above the substrate by a spacing portion, the substrate, the spacing portion, and the vibration diaphragm enclosing a vacuum chamber, and a static deflection distance of the vibration diaphragm under an atmospheric pressure being less than a distance between the vibration diaphragm and the substrate, wherein: a lower electrode forming a capacitor structure with the vibration diaphragm is provided on the substrate, and an electret layer providing an electric field between the vibration diaphragm and the lower electrode is provided on the substrate.

Optionally, the vibration diaphragm comprises an insulating material, and an upper electrode forming a capacitor structure with the lower electrode is provided on the vibration diaphragm.

Optionally, the vibration diaphragm comprises a composite structure, the upper electrode being provided in the composite structure of the vibration diaphragm.

Optionally, the upper electrode on the vibration diaphragm is electrically connected to a circuit layout on the substrate via a lead.

Optionally, the vibration diaphragm has a mechanical sensitivity of 0.02 to 0.9 nm/Pa.

Optionally, an initial gap between the vibration diaphragm and the substrate is 1-100 μm.

Optionally, the MEMS microphone further comprises an ASIC circuit integrated on the substrate.

Optionally, a reinforcing portion is provided at a central region of the vibration diaphragm that is away from the vacuum chamber.

Optionally, a bonding pad for an external connection is provided on a side of the substrate that is away from the vacuum chamber.

Optionally, the electric field between the vibration diaphragm and the lower electrode is 100-300 V/μm.

According to the MEMS microphone of the present disclosure, the vacuum chamber is enclosed between the vibration diaphragm and the substrate, such that the high electric field can be provided via the electret layer, and the high electric field can be formed in the vacuum chamber without breakdown, thereby greatly improving the sensitivity of the MEMS microphone.

According to the MEMS microphone of the disclosure, the vacuum chamber is enclosed between the vibration diaphragm and the substrate, and the air viscosity in the vacuum chamber is much lower than the air viscosity at the ambient pressure, thereby reducing an influence of acoustic resistance on a vibration of the vibration diaphragm, and increasing a signal-to-noise ratio of the microphone. In addition, since such an MEMS microphone does not have a back cavity with a relatively large volume, an overall size of the MEMS microphone can be greatly reduced, and reliability of the microphone is enhanced.

Further features of the present disclosure and advantages thereof will become apparent from the following detailed description of exemplary embodiments according to the present disclosure with reference to the attached drawings.

BRIEF DESCRIPTION OF THE DRAWINGS

The accompanying drawings, which are incorporated in and constitute a part of the description, illustrate embodiments of the present disclosure and, together with the description thereof, serve to explain the principles of the present disclosure.

DETAILED DESCRIPTION

Technical problems to be solved, technical solutions to be adopted, and technical effects to be obtained by the present disclosure are to be easily understood from the further detailed description of particular embodiments according to the present disclosure in conjunction with the attached drawings.

Figure 1:
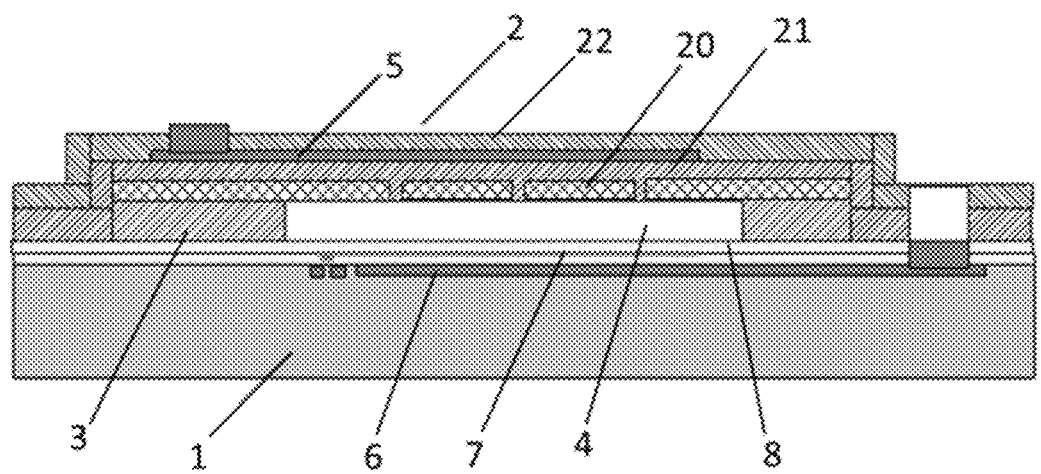
FIG. 1 is a schematic structural view of a first embodiment of a microphone of the present disclosure.

Referring to FIG. 1, the present disclosure provides an MEMS microphone comprising a substrate 1 and a vibration diaphragm 2 supported above the substrate 1 by a spacing portion 3. The substrate 1, the spacing portion 3, and the vibration diaphragm 2 enclose a vacuum chamber 4.

The substrate 1 according to the present disclosure can be made of monocrystalline silicon or other materials well known to those skilled in the art, and the spacing portion 3 and the vibration diaphragm 2 supported on the substrate 1 by the spacing portion 3 can be formed by depositing layer by layer, patterning and sacrificial processes. If necessary, an insulating layer 8 is further provided between the spacing portion 3 and the substrate 1, which will not be specifically explained herein.

The vacuum chamber 4 can be sealed, for example, by low pressure plasma enhanced chemical vapor deposition (PECVD) at 200-350° C. Such MEMS process belongs to common general knowledge of those skilled in the art and will not be specifically explained herein. The vacuum chamber 4 is preferably less than 1 kPa, so that the residual air viscosity in the vacuum chamber 4 is much lower than the air viscosity at standard pressure.

Since the vacuum chamber having an air pressure lower than the atmospheric pressure is formed between the vibration diaphragm 2 and the substrate 1, the vibration diaphragm 2 is statically deflected under the atmospheric pressure and without a sound pressure, that is, the vibration diaphragm 2 is statically deflected towards the substrate 1. In order to prevent the vibration diaphragm 2 from being deflected to get into contact with the substrate 1 when the vibration diaphragm 2 is static, a static deflection distance of the vibration diaphragm 2 is designed to be less than a distance between the vibration diaphragm 2 and the substrate 1, which can be implemented mainly by changing the rigidity of the vibration diaphragm 2 and/or the distance between the vibration diaphragm 2 and the substrate 1.

For example, the thickness of the vibration diaphragm 2 can be increased, and of course, the rigidity of the vibration diaphragm 2 can also be enhanced by selecting a suitable material of the vibration diaphragm 2. For example, the vibration diaphragm 2 can be designed to have the mechanical sensitivity of 0.02 to 0.9 nm % Pa. That is to say, each time a pressure of 1 Pa is applied, the vibration diaphragm 2 will have a deflection of 0.02-0.9 nm. The vibration diaphragm 2 is 10-100 times as rigid as a conventional vibration diaphragm, so that the vibration diaphragm 2 is rigid enough to resist the atmospheric pressure in an ambient environment.

An initial gap between the vibration diaphragm 2 and the substrate 1 can be designed in a range of 1-100 µm. The above-mentioned rigid vibration diaphragm 2 will not collapse under the atmospheric pressure.

In order to improve the sensitivity of the MEMS microphone, the MEMS microphone may adopt a highly-sensitive detection member, for example an electret based capacitance detection structure.

In a specific embodiment of the present disclosure, the detection structure comprises a lower electrode 6 provided on the substrate 1, and the lower electrode 6 and the vibration diaphragm 2 form a capacitor structure capable of outputting a varying electrical signal.

In another specific embodiment of the present disclosure, the vibration diaphragm 2 may adopt an insulating material, and an upper electrode 5 is provided on the vibration diaphragm 2. The lower electrode 6 and the upper electrode 5 on the vibration diaphragm 2 form the capacitor structure capable of outputting a varying electrical signal. The upper electrode 5 and the lower electrode 6 can be formed by MEMS depositing and etching processes well known to those skilled in the art, which will not be specifically explained herein.

The lower electrode 6 can be provided on a side of the substrate 1 that is adjacent to the vacuum chamber 4. Optionally, an insulating layer 8 is provided to cover the lower electrode 6. The upper electrode 5 can be provided on a side of the vibration diaphragm 2 that is adjacent to or away from the vacuum chamber 4.

Alternatively, the vibration diaphragm 2 may adopt a composite structure. For example, in order to form the vacuum chamber, a covering layer 20 having sacrificial holes is firstly provided on a sacrificial layer, and the sacrificial layer below the covering layer 20 is etched off through the sacrificial holes. A filling layer 21 is then deposited above the covering layer 20 to seal the sacrificial holes in the covering layer 20 to form the vacuum chamber. The upper electrode 5 can be provided in the composite structure of the vibration diaphragm 2, for example formed on the filling layer 21 with a passivation layer 22 provided outside, and will not be specifically explained herein.

In the microphone of the present disclosure, an electret layer 7 is provided on the substrate 1 for providing an electric field between the vibration diaphragm 2/upper electrode 5 and the lower electrode 6. The electret layer 7 is provided on the substrate 1 above the lower electrode 6 and covered by the insulating layer 8. An interval between the upper electrode 5 and the lower electrode 6 changes when the vibration diaphragm 2 vibrates, so that the capacitor structure can output the varying electrical signal. The working principle of such capacitors belongs to common general knowledge of those skilled in the art.

In a specific embodiment of the present disclosure, the electret layer 7 can be configured to provide an electric field in a range of 100-300V/µm between the vibration diaphragm 2 and the lower electrode 6.

According to the MEMS microphone of the present disclosure, since the vibration diaphragm 2 and the substrate 1 enclose the vacuum chamber 4, a high electric field can be formed in the vacuum chamber 4 without breakdown, and in particular the vibration diaphragm 2 having a high rigidity is used. In the present disclosure, the electric field between the upper electrode 5 and the lower electrode 6 is 100-300V/µm, that is, several hundred volts exist in a vacuum gap of several micrometers, and is 10 to 100 times as much as the electric field of a conventional microphone. Therefore, the sensitivity of the MEMS microphone according to the present disclosure can be greatly improved.

According to the MEMS microphone of the disclosure, the vacuum chamber is enclosed between the vibration diaphragm 2 and the substrate 1, and the air viscosity in the vacuum chamber is much lower than the air viscosity at an ambient pressure, thereby reducing an influence of acoustic resistance on a vibration of the vibration diaphragm, and improving a signal-to-noise ratio of the microphone. In addition, since such an MEMS microphone does not have a back cavity with a relatively large volume, an overall size of the MEMS microphone can be greatly reduced, and reliability of the microphone is enhanced.

Figure 2:
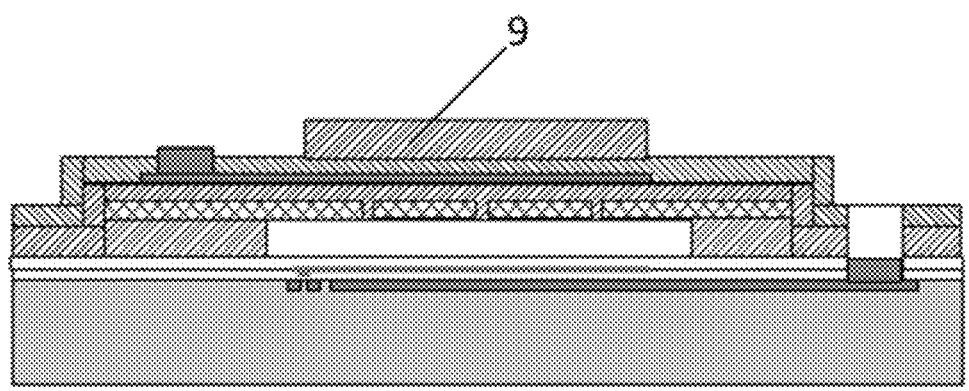
FIG. 2 is a schematic structural view of a second embodiment of the microphone of the present disclosure.

In an optional embodiment of the present disclosure, a reinforcing portion 9 is provided in a central region of a side of the vibration diaphragm 2 away from the vacuum chamber, with reference to FIG. 2. The reinforcing portion 9 is configured to reinforce the rigidity of the central region of the vibration diaphragm 2, can be regarded as a central thickening layer, and is made of a material same as or different from the vibration diaphragm 2.

Figure 3:
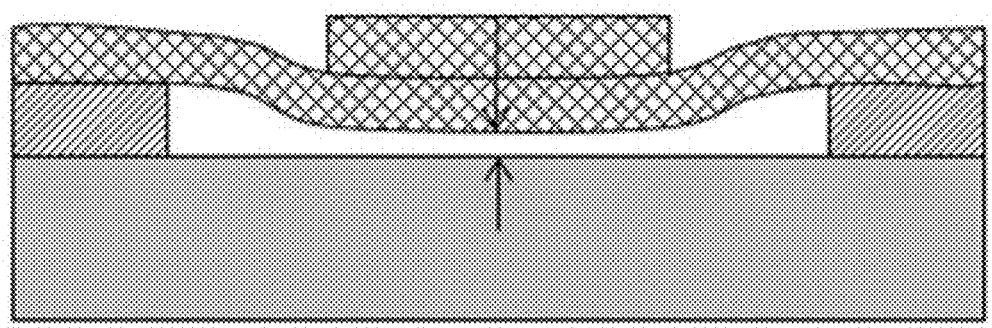
FIG. 3 is a schematic view of an action principle of the microphone of the embodiment in FIG. 2.

Referring to FIG. 3, when the vibration diaphragm 2 vibrates, the region of the vibration diaphragm 2 reinforced by the reinforcing portion 9 can be deflected towards the substrate 1 synchronously by disposing the reinforcing portion 9 in the central region of the vibration diaphragm 2. The central region of the vibration diaphragm 2 performs a piston movement similar to an upper and lower translation, rather than an arc-shaped bending motion performed by the conventional vibration diaphragm, which increases the amount of variation detected by the capacitor.

The MEMS microphone according to the present disclosure can also be manufactured by a bonding process in addition to a process of surface micromachining or bulk silicon micromachining.

During the manufacturing, by for example surface micromachining or bulk silicon micromachining, a part of the spacing portion, the lower electrode and the electret layer are formed on a first substrate, and the vibration diaphragm and the other part of the spacing portion are formed on a second substrate. Then, the two parts of the spacing portion are bonded together in a vacuum environment by a bonding process. After the second substrate is completely removed, the upper electrode, the passivation layer, a bonding pad and the like can be formed on the vibration diaphragm 2, which will not be specifically explained herein.

According to the microphone of the present disclosure, the upper electrode 5 on the vibration diaphragm 2 can be connected onto pins or in a circuit layout of the substrate 1 via a lead. Since the spacing portion 3 exists between the vibration diaphragm 2 and the substrate 1, for an electric connection, one end of the lead is electrically connected to the upper electrode 5, and the other end of the lead extends on the vibration diaphragm 2 to the spacing portion 3 and passes through the spacing portion 3 to be connected into the circuit layout of the substrate 1. Since the lower electrode 6 is provided on the substrate 1, the lower electrode 6 can be directly electrically connected to the circuit layout of the substrate 1 via a lead, which will not be specifically explained herein.

Figure 4:
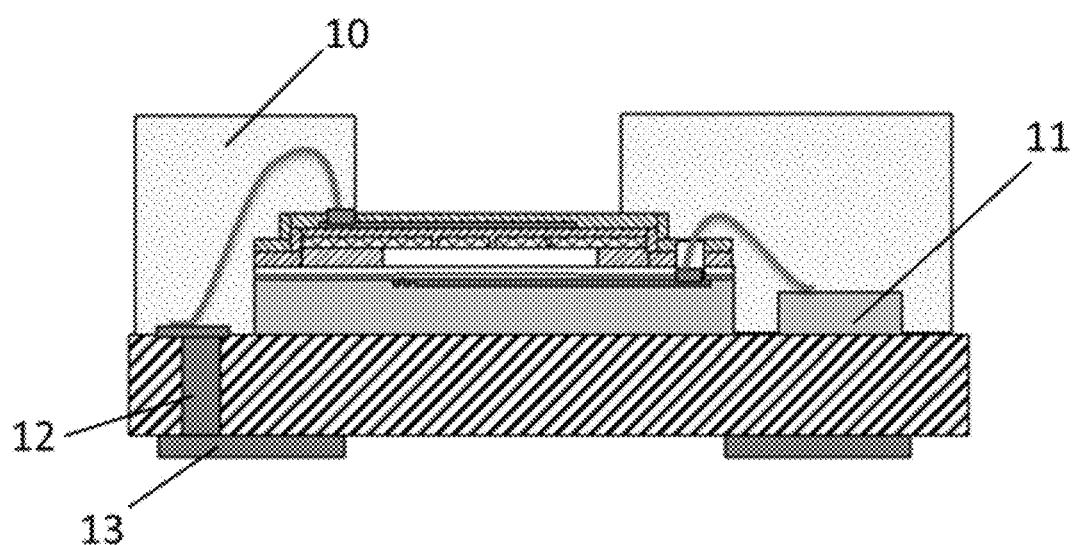
FIG. 4 is a schematic view of one of packaging manners for the microphone of the present disclosure.

The MEMS microphone according to the present disclosure does not require the back cavity of a relatively large volume, so that a wafer level package (WLP) can be completely adopted, and the microphone can be directly mounted on an external terminal without a conventional PCB package. In a specific embodiment of the present disclosure, referring to FIG. 4, a bonding pad 13 is formed at one end of the substrate 1 away from the vacuum chamber 4, and the electrical signal from the substrate 1 can be transmitted onto the bonding pad 13 via a metallized through hole 12, so that the MEMS microphone can be mounted directly to the external terminal via the bonding pad 13.

In an optional embodiment of the present disclosure, an ASIC circuit of the microphone can be integrated on the substrate 1, and an output end of the capacitor can be electrically connected to the ASIC circuit via the circuit layout on or in the substrate 1, so that the electrical signal output by capacitor the can be processed by the ASIC circuit. Alternatively, an ASIC chip 11 can be directly integrated on the substrate 1, which will not be specifically explained herein.

Optionally, an edge of the vibration diaphragm 2, the substrate 1 and the ASIC chip 11 are packaged by a plastic body, and only a region where the vibration diaphragm 2 is suspended is exposed In another specific embodiment of the present disclosure, externally connected pins can be formed on an upper surface of the substrate (that is adjacent to the vibration diaphragm), and the microphone can be directly mounted on the external terminal by projection welding (solder ball mounting).

Of course, the MEMS microphone according to the present disclosure may also adopt the conventional package structure, for example, a package structure defined by a circuit board and a shell is provided. The MEMS microphone is mounted in the package structure to form a conventional top or bottom package structure, and is finally mounted on the external terminal in the form of a microphone module.

The present disclosure has been explained in detail by the preferred embodiments. However, variations and additions on the various embodiments are obvious for those ordinary skilled in the art by reading the foregoing context. The applicant intends to include all such variations and additions within the scope of claims of the present disclosure.

Similar numbers refer to similar elements in the text. For the sake of clarity, some of the lines, layers, elements, components or features can be enlarged in the drawings.

The terms used herein are merely for the purpose of illustrating specific embodiments rather than limiting the present disclosure. Unless otherwise defined, all terms (including technical terms and scientific terms) used herein are the same as those understood by the ordinary skilled in the art of the present disclosure.

The invention claimed is:

1. A MEMS microphone, comprising a substrate and a vibration diaphragm supported above the substrate by a spacing portion, the substrate, the spacing portion, and the vibration diaphragm enclosing a vacuum chamber, wherein a static deflection distance of the vibration diaphragm under an atmospheric pressure being less than a distance between the vibration diaphragm and the substrate, wherein:
a lower electrode forming a capacitor structure with the vibration diaphragm is provided on the substrate, and an electric layer providing an electric field between the vibration diaphragm and the lower electrode is provided on the substrate.

2. The MEMS microphone according to claim 1, wherein the vibration diaphragm comprises an insulating material, and an upper electrode forming a capacitor structure with the lower electrode is provided on the vibration diaphragm.

3. The MEMS microphone according to claim 1, wherein the vibration diaphragm comprises a composite structure, an upper electrode being provided in the composite structure of the vibration diaphragm.

4. The MEMS microphone according to claim 1, wherein an upper electrode on the vibration diaphragm is electrically connected to a circuit layout on the substrate via a lead.

5. The MEMS microphone according to claim 1, wherein the vibration diaphragm has a mechanical sensitivity of 0.02 to 0.9 nm/Pa.

6. The MEMS microphone according to claim 1, wherein an initial gap between the vibration diaphragm and the substrate is 1-100 µm.

7. The MEMS microphone according to claim 1, further comprising an ASIC circuit integrated on the substrate.

8. The MEMS microphone according to claim 1, wherein a reinforcing portion is provided at a central region of the vibration diaphragm that is away from the vacuum chamber.

9. The MEMS microphone according to claim 1, wherein a bonding pad for an external connection is provided on a side of the substrate that is away from the vacuum chamber.

10. The MEMS microphone according to claim 1, wherein the electric field between the vibration diaphragm and the lower electrode is 100-300 V/µm.

* * * * *